United States Patent [19]

Mimura et al.

[11] Patent Number: 4,702,791
[45] Date of Patent: Oct. 27, 1987

[54] METHOD FOR MANUFACTURING BISMUTH-CONTAINING OXIDE SINGLE CRYSTAL

[75] Inventors: Yoshinori Mimura, Wako; Yasuyuki Nagao, Yokohama, both of Japan

[73] Assignee: Kokusai Denshin Denwa Kabushiki Kaisha, Tokyo, Japan

[21] Appl. No.: 879,905

[22] Filed: Jun. 30, 1986

[30] Foreign Application Priority Data

Jul. 16, 1985 [JP] Japan ................................ 60-155232

[51] Int. Cl.$^4$ ............................................. C30B 25/00
[52] U.S. Cl. .................... 156/614; 118/715; 118/716; 156/613; 156/DIG. 64; 156/DIG. 67; 156/DIG. 74; 156/DIG. 79; 423/326; 423/593; 423/594; 427/255.3
[58] Field of Search ............... 156/613, 614, DIG. 64, 156/DIG. 67, DIG. 74, DIG. 79, DIG. 20; 118/715, 716; 423/594, 593, 326; 427/255.2, 255.3

[56] References Cited

U.S. PATENT DOCUMENTS

| | | | |
|---|---|---|---|
| 4,092,208 | 5/1978 | Brice et al. | 156/DIG. 79 |
| 4,098,923 | 7/1978 | Alberti et al. | 427/255.3 |
| 4,187,139 | 2/1980 | Brice et al. | 423/326 |
| 4,235,663 | 11/1980 | Okamoto et al. | 156/DIG. 87 |
| 4,330,524 | 5/1982 | Grameier et al. | 156/DIG. 67 |
| 4,508,590 | 4/1985 | Kaplan et al. | 156/DIG. 74 |

FOREIGN PATENT DOCUMENTS

| | | | |
|---|---|---|---|
| 2902517 | 7/1979 | Fed. Rep. of Germany | 423/326 |
| 9107987 | 2/1973 | Japan | 156/614 |
| 2060989 | 11/1975 | Japan | 427/255.3 |
| 0058899 | 5/1977 | Japan | 427/255.3 |
| 0151320 | 9/1983 | Japan | 423/326 |
| 0151319 | 9/1983 | Japan | 423/326 |

OTHER PUBLICATIONS

Hill et al., J. Mat. Sc. 9 (1974) pp. 1252-1254.

Primary Examiner—Asok Pal
Attorney, Agent, or Firm—Robert E. Burns; Emmanuel J. Lobato

[57] ABSTRACT

A method is disclosed for manufacturing a bismuth-containing oxide single crystal, in which vapor of bismuth or alkylated bismuth and vapor of an organic compound of other metal ion components of a crystal are introduced into a heated reaction chamber to be reacted with oxygen gas, so that the desired bismuth-containing oxide single crystal is deposited on a substrate prepared in the reaction chamber. A $Bi_{12}SiO_{20}$ single oxide crystal can be produced by the use of bismuth or alkylated bismuth and alkylated silicon or silicon alkoxide or by the use of bismuth or alkylated bismuth and alkylated germanium or germanium alkoxide. A $(Y_{1-x}Bi_x)_3Fe_5O_{12}$ single crystal can be poduced by the use of bismuth or alkylated bismuth yttrium alkoxide and carbonyl iron.

7 Claims, 2 Drawing Figures

METHOD FOR MANUFACTURING BISMUTH-CONTAINING OXIDE SINGLE CRYSTAL

BACKGROUND OF THE INVENTION

The present invention relates to a method for manufacturing an oxide single crystal which contains bismuth as a crystal constituent, and more particularly to a method of making high purity single crystals of $Bi_{12}SiO_{20}$, $Bi_{12}GeO_{20}$, $(Y_{1-x}Bi_x)_3Fe_5O_{12}$, etc. which are employed for optical devices for image processing, optical arithmetic elements, magneto-optical elements, and so forth.

Many single crystals of bismuth-containing oxides such as $Bi_{12}SiO_{20}$, $Bi_{12}GeO_{20}$, $(Y_{1-x}Bi_x)_3Fe_5O_{12}$ and so on are of great value because they have excellent electro-optical or magneto-optical characteristics, and single crystals of such oxides have already been also manufactured.

Single crystals of congruently fusible compounds, such as $Bi_{12}SiO_{20}$ and $Bi_{12}GeO_{20}$, are produced through a melting-pulling process. With this method, raw materials such as $Bi_2O_3$ and $SiO_2$, or $GeO_2$ are heated to the molten state in a crucible and the single crystal is pulled up, in a rod-like form, from the melt through use of a seed crystal. The single crystal of an incongruently fusible compound, such as $(Y_{1-x}Bi_x)_3Fe_5O_{12}$, is produced by a flux method. With this method, raw materials such as $Bi_2O_3$, $Fe_2O_3$ and $Y_2O_3$ and fluxes such as PbO and $B_2O_3$ are made molten by heating in a crucible and then gradually cooled to thereby precipitate a bulk of single crystal, or a single crystal substrate is brought into contact with the melt to precipitate thereon a single crystal film.

The above conventional single crystal manufacturing methods all involve the melting of raw materials by heating in the crucible. Accordingly, it is essential, for the fabrication of a high purity single crystal, that high purity raw materials be used and that no chemical reaction be caused between the crucible and the melt so that the crucible material will not get mixed as an impurity into the melt. In the fabrication of a bismuth-containing oxide single crystal, however, crucibles of any material are equally corroded due to the strong chemical reactivity of the $Bi_2O_3$ melt; it is therefore impossible to prevent the crucible material from mixing into the melt. This leads not only to rapid consumption of the crucible which is composed of a costly material, for instance, platinum, but also to the degradation of the electro-optical or magneto-optical characteristics of the single crystal by the impurity mixed therein.

As described above, when using conventional manufacturing methods difficulties are encountered in producing high purity bismuth-containing oxide single crystals, and a satisfactory method is not yet available for obtaining high purity single crystals.

SUMMARY OF THE INVENTION

An object of the present invention is to provide a method for manufacturing oxide single crystals containing bismuth of an ultrahigh purity of 99.9999% or more.

The manufacturing method of the present invention, which is intended to avoid the use of the $Bi_2O_3$ melt of extremely high chemical reactivity, features the use of bismuth or alkylated bismuth as a raw material and the formation of a single crystal film through a vapor growth process. In other words, the gist of the present invention resides in that the vapor of bismuth or alkylated bismuth is introduced into a heated reaction chamber, together with the vapor of an organic compound of other metal ion components of the crystal, and they are allowed to be reacted with oxygen gas, thereby depositing a desired bismuth-containing oxide single crystal film on a substrate.

The principle of the present invention will be described in comparison with the prior art. Any of the conventional methods of making the bismuth-containing single crystal calls for melting $Bi_2O_3$ in the crucible; therefore, the crucible material is corroded, constituting a source of impurities. A solution to this problem is to disuse the crucible, or employ a manufacturing method which uses it but does not include $Bi_2O_3$ in the raw materials. From such a point of view, the inventor has explored the possibilities of fabrication of the bismuth-containing oxide single crystal through the vapor growth process. There has been no precedent for the production of the bismuth-containing oxide single crystal by the vapor growth technique, but as for bismuth-free oxides, there have been some precedents in the past; reports have been made on the fabrication of $Y_3Fe_5O_{12}$, $NiFe_2O_4$, $CoFe_2O_4$, $NiO$, $Al_2O_3$, etc., for instance. Manufacturing methods of these oxide single crystals all employ, as raw materials, chlorides, bromides or like halides of high vapor pressure and introduce vapor resulting from heating of the raw material into a reaction chamber, wherein it is oxidized by reaction with $O_2$ gas, $H_2O$ gas, and other similar gas introduced thereinto via other routes, thereby depositing the oxide single crystal on a substrate. For example, in case of the $Y_3Fe_5O_{12}$ single crystal, $YCl_3$, $FeCl_2$, $FeBr_2$ are used as raw materials. These raw materials are sublimed by heating in the crucible and then the resulting vapor is fed into the reaction chamber by the aid of an inert gas. Since the gases of $O_2$, $H_2O$, and HCl are fed into the reactor via separate routes, the vapors of $YCl_3$, $FeCl_2$, and $FeBr_2$ are oxidized and deposited as oxides on a GGG, YAG, or like substrate. In this instance, the $Y_3Fe_5O_{12}$ single crystal could be obtained by properly adjusting the blending ratio of the raw material gases and the flow rates of the $O_2$, $H_2O$ and HCl gases. The HCl gas is used for controlling the rate of the oxidizing reaction.

However, the present inventor's studies have revealed that the desired bismuth-containing oxide single crystals could not be obtained even by applying such a conventional vapor growth process. For instance, in the case of producing the $(Y_{1-x}Bi_x)_3Fe_5O_{12}$ single crystal through utilization of the prior art vapor growth technique, it is considered that it would be necessary only to feed vapors of $BiCl_3$ and $SiCl_4$, or $BiCl_3$, $YCl_3$ and $FeCl_2$ into the reactor for the oxidizing reaction with $O_2$, $H_2O$ and other gases; in practice, however, the desired single crystal could not be obtained at all by such a method. The present inventors have made various studies to determine the causes for the failure, and as a result of their studies, the following causes have been found. The $BiCl_3$ is difficultly oxidizable by such a method and Cl remains in the product. Furthermore, bismuth oxide readily reacts with gases of $Cl_2$, HCl, etc. and even after being deposited as an oxide single crystal film, it is corroded by these gases. This indicates that the traditional vapor growth process employing halides as raw materials cannot be applied to the manufacture of a bismuth-containing oxide single crystal because of high affinity of bismuth for halide gases.

The present inventors have examined various compounds for raw materials on the basis of the results of their studies and finally found that the fabrication of bismuth-containing oxide single crystals by vapor growth is possible by using, as a material for bismuth, alkylated bismuth such as $Bi(CH_3)_3$ or $Bi(C_2H_5)_3$, or bismuth metal and, as materials of other metal ion components of a crystal organic metallic compounds such as $Si(CH_3)_4$, $Ge(OC_2H_5)_4$, $Fe(CO)_5$, etc.

The use of these raw materials not only permits vapor growth but also provides advantages such that since they are mostly liquid at room temperature, no crucible needs to be used and a high purity above 6N (99.9999%) can easily be achieved by purification through distillation. In case of bismuth metal, it is necessary to generate bismuth vapor by melting it in a crucible, but since the bismuth melt, unlike the $Bi_2O_3$ melt, does not react at all with the crucible material such as $SiO_2$ or $Al_2O_3$, the crucible will not constitute a source of impurities.

BRIEF DESCRIPTION OF THE DRAWINGS

The present invention will be described in detail below with reference to the accompanying drawings, in which.

EXAMPLES OF THE INVENTION

Figure 1:
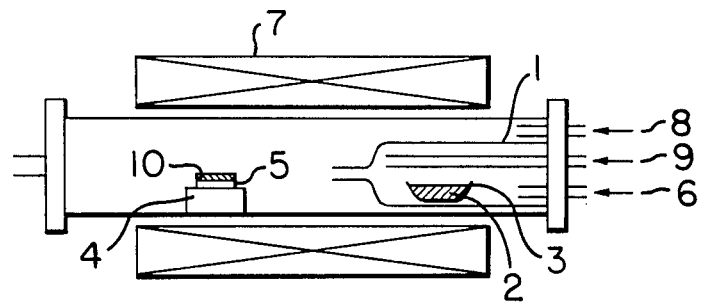
FIG. 1 is a longitudinal-sectional view schematically illustrating an example of apparatus for a manufacturing method employing bismuth metal as a raw material.

A description will hereinafter be given of examples of the present invention. FIG. 1 illustrates an example of apparatus for the manufacturing method employing bismuth metal as a raw material. In FIG. 1 an inner tube 1 of quartz contains bismuth metal 2 which is held in an $Al_2O_3$ crucible 3. A substrate support table 4 supports the substrate 5. The apparatus also includes an Ar gas inlet port 6, an electric furnace 7, an $O_2$ gas inlet port 8, and a raw material gas inlet port 9 and a single crystal 10 is shown deposited on the substrate. The manufacture of the bismuth-containing oxide single crystal by this method starts with placing the $Al_2O_3$ crucible 3 carrying the bismuth 2 in the quartz inner tube 1, followed by placing the substrate 5 on the substrate support table 4. Next, Ar gas is introduced from the Ar gas inlet port 6 to provide an inert atmosphere in the quartz inner tube 1, and then the bismuth metal 2 and the substrate 5 are heated by the electric furnace 7. After the temperature in the furnace has reached a fixed value, $O_2$ gas and a raw material gas are introduced into the furnace from the $O_2$ gas inlet port 8 and the raw material gas inlet port 9, respectively, initiating crystal growth. In practice, $Si(OCH_3)_4$ was used as the raw material gas and the (111) crystal face of a $Bi_{12}SiO_{20}$ single crystal was used as the substrate 5, and the vapor growth was performed under conditions such as a substrate temperature of 800° C., an $O_2$ gas flow rate of 200 cc/min, an Ar gas flow rate of 2 l/min, and a $Si(OCH_3)_4$ gas flow rate of 5 cc/min. As a result, a $Bi_{12}SiO_{20}$ single crystal could be deposited about 8 μm thick on the substrate 5 in an hour.

Figure 2:
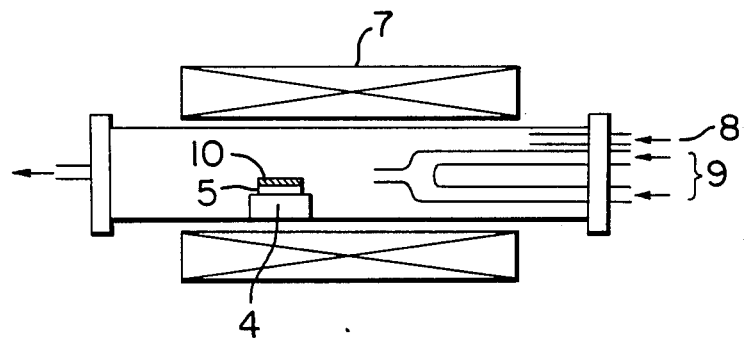
FIG. 2 is a longitudinal-sectional view schematically illustrating an example of apparatus for a manufacturing method employing alkylated bismuth as a raw material.

FIG. 2 illustrates an example of apparatus for the manufacture of the bismuth-containing oxide single crystal through use of alkylated bismuth as a raw material. The same reference numerals as those in FIG. 1 identify the same parts and elements. This manufacturing method differs from that of FIG. 1 in that since the alkylated bismuth is liquid at room temperature, the crucible 3 is not used but instead the alkylated bismuth is introduced, by bubbling of an inert gas, from raw material gas inlet ports 9. $Bi(C_2H_5)_3$ and $Si(OC_2H_5)$ were used as raw materials and the (111) crystal face of the $Bi_{12}SiO_{20}$ single crystal was used as the substrate 5, and the vapor growth was performed for an hour under conditions such as a substrate temperature of 800° C., an $O_2$ gas flow rate of 800 cc/min, a $Bi(C_2H_5)_3/Ar$ gas flow rate of 200 cc/min, and a $Si(OC_2H_5)/Ar$ gas flow rate of 4 cc/min. As a result, a $Bi_{12}SiO_{20}$ single crystal film could be deposited 25 μm thick on the substrate 5.

As described above, the manufacturing method of the present invention is completely free from contamination with impurities from the crucible and allows ease in utilization of extremely high purity raw materials. This permits the fabrication of high purity bismuth-containing oxide single crystals of excellent electro-optical or magneto-optical characteristics.

What we claim is:

1. A method for manufacturing a single crystal of an oxide containing bismuth and other metal, comprising introducing bismuth vapor or alkylated bismuth vapor and vapor of an organic compound of the other metal into a heated reaction chamber containing a substrate suitable for growing said single crystal of said oxide containing bismuth and other metal and reacting the bismuth or alkylated bismuth and organic compound of the other metal with oxygen, thereby depositing a single crystal of a bismuth-containing oxide of high purity on the substrate.

2. The method of manufacturing a single crystal of an oxide containing bismuth and other metal according to claim 5 in which the substrate is a single crystal.

3. The method of manufacturing a single crystal of an oxide containing bismuth and other metal according to claim 5 in which the substrate is a single crystal of said oxide containing bismuth and other metal.

4. The method of manufacturing a single crystal of an oxide containing bismuth and other metal according to claim 1, in which bismuth vapor or alkylated bismuth vapor and vapor of alkylated silicon or silicon alkoxide is reacted with oxygen and a single crystal of the formula $Bi_{12}SiO_{20}$ is deposited on the substrate.

5. The method of manufacturing a single crystal of an oxide containing bismuth and other metal according to claim 4, in which the substrate is a single crystal of the formula $Bi_{12}SiO_{20}$.

6. The method of manufacturing a single crystal of an oxide containing bismuth and other metal according metal according to claim 1, in which bismuth vapor or alkylated bismuth vapor and vapor of alkylated germanium or germanium alkoxide is reacted with oxygen and a single crystal of the formula $Bi_{12}GeO_{20}$ is deposited on the substrate.

7. The method of manufacturing a single crystal of an oxide containing bismuth and other metal according to claim 1, in which bismuth vapor or alkylated bismuth vapor of yttrium alkoxide and vapor of iron carbonyl are reacted with oxygen and a single crystal of oxide containing bismuth, yttrium and iron is deposited on the substrate.

* * * * *